(12) United States Patent
Nomura

(10) Patent No.: US 9,991,518 B2
(45) Date of Patent: Jun. 5, 2018

(54) POLYTHIOPHENE DERIVATIVE, METHOD FOR PRODUCING SAME, POSITIVE ELECTRODE ACTIVE MATERIAL FOR SECONDARY BATTERIES, AND SECONDARY BATTERY

(71) Applicant: Masayoshi Nomura, Shizuoka (JP)

(72) Inventor: Masayoshi Nomura, Shizuoka (JP)

(73) Assignee: RICOH COMPANY, LTD., Tokyo (JP)

( * ) Notice: Subject to any disclaimer, the term of this patent is extended or adjusted under 35 U.S.C. 154(b) by 79 days.

(21) Appl. No.: 15/106,562

(22) PCT Filed: Jan. 13, 2015

(86) PCT No.: PCT/JP2015/050575
§ 371 (c)(1),
(2) Date: Jun. 20, 2016

(87) PCT Pub. No.: WO2015/115158
PCT Pub. Date: Aug. 6, 2015

(65) Prior Publication Data
US 2017/0346095 A1    Nov. 30, 2017

(30) Foreign Application Priority Data
Jan. 28, 2014 (JP) .................................. 2014-013572

(51) Int. Cl.
*C08G 75/00*    (2006.01)
*H01M 4/60*    (2006.01)
(Continued)

(52) U.S. Cl.
CPC .......... *H01M 4/608* (2013.01); *C08G 61/126* (2013.01); *H01M 10/0565* (2013.01);
(Continued)

(58) Field of Classification Search
CPC ................ C08G 75/00; C08G 2261/43; C08G 2261/312; C08G 2261/145;
(Continued)

(56) References Cited

U.S. PATENT DOCUMENTS

| 4,833,048 A | 5/1989 | Dejonghe et al. |
| 2004/0115529 A1 | 6/2004 | Nakahara et al. |

(Continued)

FOREIGN PATENT DOCUMENTS

| JP | 7-085420 | 9/1995 |
| JP | 2715778 | 11/1997 |

(Continued)

OTHER PUBLICATIONS

Korean official action (and English translation thereof) dated Jun. 19, 2017 in connection with corresponding Korean patent application No. 10-2016-7023624.

(Continued)

*Primary Examiner* — Shane Fang
(74) *Attorney, Agent, or Firm* — Cooper & Dunham LLP

(57) ABSTRACT

A polythiophene derivative including
a repeating unit represented by General Formula (1) below:

General Formula (1)

$$\left[\begin{array}{c}\text{S}\\ \\ \text{S}\quad\text{S}\\ R^1\quad R^2\end{array}\right]_m\left[\text{Ar}\right]_n$$

(Continued)

where $R^1$ and $R^2$ each independently denote a group having from 2 through 9 carbon atoms represented by —$(R^3$—$S)_p$—$R^4$ (where $R^3$ denotes an alkylene group having from 1 through 4 carbon atoms, $R^4$ denotes an alkyl group having from 1 through 6 carbon atoms or an aromatic group having from 5 through 6 carbon atoms, and p denotes an integer of 1 or 2), Ar denotes an optionally substituted divalent or monovalent aromatic ring moiety or aromatic heterocyclic moiety, m denotes a natural number of 2 or more, and n denotes a natural number of 0 or 2 or more.

5 Claims, 4 Drawing Sheets

(51) Int. Cl.
  *C08G 61/12* (2006.01)
  *H01M 10/0565* (2010.01)
  *H01M 4/02* (2006.01)

(52) U.S. Cl.
  CPC .............. *C08G 2261/145* (2013.01); *C08G 2261/1424* (2013.01); *C08G 2261/312* (2013.01); *C08G 2261/3223* (2013.01); *C08G 2261/43* (2013.01); *C08G 2261/514* (2013.01); *H01M 2004/028* (2013.01)

(58) Field of Classification Search
  CPC ...... C08G 2261/1424; C08G 2261/514; C08G 2261/3223; H01M 4/608; H01M 10/0565
  See application file for complete search history.

(56) References Cited

U.S. PATENT DOCUMENTS

| | | |
|---|---|---|
| 2005/0209388 A1 | 9/2005 | Hsu et al. |
| 2009/0127491 A1* | 5/2009 | Kakiuchi ............. C07D 333/34 252/62.2 |
| 2010/0084637 A1 | 4/2010 | Choi et al. |
| 2010/0104951 A1 | 4/2010 | Iwama et al. |
| 2010/0148124 A1 | 6/2010 | Reuter et al. |

FOREIGN PATENT DOCUMENTS

| | | |
|---|---|---|
| JP | 2010-080343 | 4/2010 |
| JP | 4687848 | 2/2011 |
| JP | 2012-251129 | 12/2012 |
| KR | 10-2010-0045928 | 5/2010 |
| WO | WO2005/090436 A1 | 9/2005 |
| WO | WO2008/100084 A1 | 8/2008 |
| WO | WO2009/090866 A1 | 7/2009 |

OTHER PUBLICATIONS

International Search Report dated Feb. 17, 2015 for counterpart International Patent Application No. PCT/JP2015/050575 filed Jan. 13, 2015.
Chemical Physics Letters,359,(2002)351-354.
Yasushi Morita et al., Organic tailored batteries materials using stable open-shell molecules with degenerate frontier orbitals, Nature Materials, 10, (2011) 947-951.
Shuai chen et.al., Systematic study on chemical oxidative and solid-state polymerization of poly (3,4-ethylenedithiathiophene), Journal of Polymer Science Part A:Polymer Chemistry, vol. 50, 2012, 1967-1978.
Raul Blanco et al., Functionalized 3, 4-ethylenedithiathiophenes (EDTTs) as building blocks for poly (3,4-ethylenedithiathiophene)(PEDTT) derivatives, Tetrahedron Letters, vol. 49, 2008, 2056-2059.
European search report dated Nov. 30, 2016 in corresponding European Patent Application No. 15742633.9.
Moggia F et al, "Water-compatible electrogenerated poly(thiophenes) derived from linked EDOT-based bithiophenic precursors" Electrochemistry Communications, Elsevier, Amsterdam, NL, vol. 8, No. 4, (Apr. 1, 2006) pp. 533-538.
Goldoni F et al, "Convenient Synthesis of 3, 4-Bis (alkylthio) Thiophenes", Synthetic Communications, Taylor & Francis Inc, Philadelphia, PA, US, vol. 28, No. 12, (Jan. 1, 1998), pp. 2237-2244.
Nakahara K et al, "Rechargeable batteries with organic radical cathodes" Chemical Physics Letters, Elsevier BV, NL, vol. 359, (Jan. 1, 2002), pp. 351-354.

* cited by examiner

POLYTHIOPHENE DERIVATIVE, METHOD FOR PRODUCING SAME, POSITIVE ELECTRODE ACTIVE MATERIAL FOR SECONDARY BATTERIES, AND SECONDARY BATTERY

TECHNICAL FIELD

The present invention relates to polythiophene derivatives, methods for producing the polythiophene derivatives, cathode active materials for secondary batteries using the polythiophene derivatives, and secondary batteries.

BACKGROUND ART

A battery takes out electrical energy by converting chemical energy to the electrical energy through a redox reaction at a cathode and an anode, or accumulates the electrical energy through a reverse reaction thereof. The battery has been used as a power source in various devices. Recently, due to rapid market growth of a device such as a laptop computer or a smartphone, a demand has been increasing for dramatically improving energy density and output density of a secondary battery used for the device. In order to alleviate the power shortage after the Great East Japan Earthquake, expectations have been rising for development of a large scale and large capacity secondary battery. For the purpose of meeting the above demands, there has been actively developed a battery that includes an alkali metal ion (e.g., a lithium ion) as a charge carrier and utilizes an electrochemical reaction in accompany with donating and accepting a charge by the charge carrier.

However, most of lithium ion batteries include an electrode material on a cathode side (cathode active material) having smaller discharge capacity (Ah/Kg) than an electrode material on an anode side (anode active material). This is a main reason why the lithium ion batteries cannot be increased in capacity. Lithium ion batteries currently available in the market include a metal oxide having high specific gravity as the cathode active material, which is problematic in terms of insufficient battery capacity per unit mass. Therefore, attempts have been made to develop a large capacity battery using a lighter electrode material.

For example, Patent documents 1 and 2 disclose a battery including an organic compound containing a disulfide bond as the cathode active material. In this battery, the disulfide bond is subjected to two-electron-reduction upon discharge to cleave a sulfide bond. The resultant products are reacted with metal ions in an electrolyte to turn into two metal thiolates. The two thiolates are subjected to two-electron-oxidation upon charge to turn back into sulfides. Thus, the battery operates as a secondary battery. This battery includes, as an electrode material, an organic compound mainly containing an element having low specific gravity (e.g., sulfur and carbon). Therefore, a certain effect can be achieved in that a large capacity battery having high energy density is made. However, there are problems of low re-bonding efficiency of cleaved disulfide bonds and unsatisfactory stability under a charge or discharge state.

Similarly, as batteries including an organic compound as an active material, Patent document 3 discloses a battery including a polypyrrole complex and Patent document 4 discloses a battery including a nitroxyl radical compound as the cathode active material. A piperidyl-group containing high molecular weight polymer or copolymer is described as the nitroxyl radical compound.

Non-patent document 1 discloses a secondary battery including 2,2,6,6-tetramethyl piperidinoxyl-7-yl methacrylate (PTMA) as the cathode active material.

However, a conductive polymer such as polypyrrole has a problem that generated charges spread throughout the polymer to cause strong Coulomb repulsion between the charges, so that the charges can be injected and emitted only in an amount equal to or smaller than a certain amount. The nitroxyl radical is advantageous in that a large current can be achieved due to rapid donation and acceptance of the charges at an electrode. However, the nitroxy radical is subjected to a redox reaction at a rate of 1 electron per 1 molecule, which is unsuitable for capacity enlargement of a secondary battery.

Meanwhile, Patent document 5 and Non-patent document 2 disclose a secondary battery including a low molecular weight organic compound having multi-step redox capacity. This battery has high capacity density, but includes the low molecular weight compound. Therefore, there is a problem that battery performance is deteriorated due to elusion to an electrolyte. There is a need to solve this problem.

CITATION LIST

Patent Document

Patent document 1: U.S. Pat. No. 4,833,048
Patent document 2: Japanese Patent No. 2715778
Patent document 3: Japanese Examined Patent Publication No. 07-85420
Patent document 4: Japanese Patent No. 4687848
Patent document 5: Japanese Unexamined Patent Application Publication No. 2010-80343

Non-Patent Document

Non-patent document 1: Chemical Physics Letters, volume 359, (2002), pp. 351-354
Non-patent document 2: Nature Materials, volume 10, (2011), pp. 947-951

DISCLOSURE OF THE INVENTION

Technical Problem

The present invention has an object to provide a polythiophene derivative which can overcome the above existing problems and is useful for producing a secondary battery having high energy density and a good cycling property.

Solution to Problem

The above problem is solved by the present invention according to (1) below.
(1) "A polythiophene derivative including a repeating unit represented by General Formula (1) below.

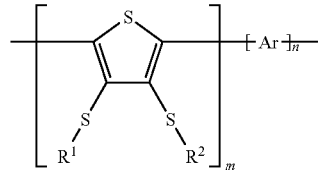

General Formula (1)

In the General Formula (1), $R^1$ and $R^2$ each independently denote a group having from 2 through 9 carbon atoms represented by $-(R^3-S)_p-R^4$ (where $R^3$ denotes an alkylene group having from 1 through 4 carbon atoms, $R^4$ denotes an alkyl group having from 1 through 6 carbon atoms or an aromatic group having from 5 through 6 carbon atoms, and p denotes an integer of 1 or 2), Ar denotes an optionally substituted divalent or monovalent aromatic ring moiety or aromatic heterocyclic moiety, m denotes a natural number of 2 or more, and n denotes a natural number of 0 or 2 or more."

Effects of the Invention

According to the present invention, a polythiophene derivative which is useful for producing a secondary battery having high energy density and a good cycling property can be provided.

MODE FOR CARRYING OUT THE INVENTION

Although the "polythiophene derivative" according to (1) described above will now be described in detail, the embodiment of the "polythiophene derivative" include a "polythiophene derivative" according to (2) described below. The present invention also includes a "method for producing a polythiophene derivative" according to (3) described below, a "cathode active material for a secondary battery" according to (4) described below, and a "secondary battery" according to (5) described below, and, therefore, these will now also be described.
(2) "The polythiophene derivative according to (1), wherein the Ar is a thiophene derivative moiety."
(3) "A method for producing a polythiophene derivative, the method including polymerizing raw material monomers with an oxidizing agent to produce the polythiophene derivative according to (1) or (2)."
(4) "A cathode active material for a secondary battery including the polythiophene derivative according to (1) or (2)."
(5) "A secondary battery including the cathode active material for a secondary battery according to (4)."

The polythiophene derivative including a repeating unit represented by the General Formula (1) of the present invention is a stabilized redox compound, and is useful for producing a secondary battery which includes, as an electrode active material, an organic compound undergoing a redox reaction in the course of at least one of a charge reaction and a discharge reaction. In particular, the polythiophene derivative is preferably used as a cathode active material.

This enables to obtain a secondary battery having high energy density and a good cycling property. This secondary battery includes the stabilized redox compound, resulting in a stabilized charge and discharge cycle and a prolonged service life.

Figure 1:
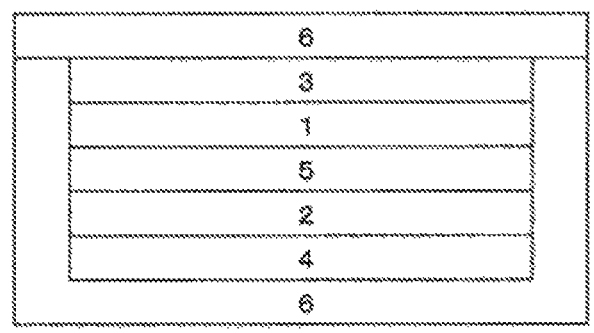
FIG. 1 is a cross-sectional view illustrating one exemplary secondary battery according to the present invention.

FIG. 1 is a cross-sectional view illustrating one exemplary secondary battery according to the present invention. This secondary battery has a configuration in which an anode collector 3, an anode layer 1, a separator 5 containing an electrolyte, a cathode layer 2, and a cathode collector 4 are laminated in this order. In this drawing, a reference numeral 6 denotes a stainless steel outer material.

Note that, a method for laminating the cathode layer and the anode layer is not particularly limited. The cathode layer and the anode layer may be multilayer-laminated, laminated on each surface of the collector, or wound around each other.
<Electrode Active Material>
[Polythiophene Derivative]
In the General Formula (1), $R^1$ and $R^2$ each independently denote a group having from 2 through 9 carbon atoms represented by $-(R^3\text{-}8)_p-R^4$ (where $R^3$ denotes an alkylene group having from 1 through 4 carbon atoms, $R^4$ denotes an alkyl group having from 1 through 6 carbon atoms or an aromatic group having from 5 through 6 carbon atoms, and p denotes an integer of 1 or 2).

The $R^1$ and the $R^2$ may be the same as or different from each other, but are preferably the same as each other.

Examples of the $R^3$ include a methylene group, a 1,1-ethylene group, a 1,2-ethylene group, a 1,3-propylene group, a 1,2-propylene group, a 1,4-buthylene group, and a 2,3-buthylene group.

Examples of the alkyl group having from 1 through 6 carbon atoms described for the $R^4$ include a methyl group, an ethyl group, a propyl group, a butyl group, a pentyl group, and a hexyl group.

Examples of the aromatic group having from 5 through 6 carbon atoms described for the $R^4$ include a phenyl group and a pyridyl group. The aromatic group having from 5 through 6 carbon atoms may have a substituent. Examples of the substituent include halogen atoms.

The Ar denotes an aromatic ring moiety or an aromatic heterocyclic moiety. This aromatic ring moiety or aromatic heterocyclic moiety is typically a divalent (monovalent in the case of a terminal moiety) moiety. Examples of an aromatic ring constituting the moiety include benzene, biphenyl, naphthalene, anthracene, fluorene, and pyrene. Examples of an aromatic heterocycle constituting the moiety include pyridine, quinoline, thiophene, furan, oxazole, oxadiazole, and carbazole. Examples of a substituent for these ring moieties include alkyl groups such as a methyl group, an ethyl group, an isopropyl group, and a butyl group; alkoxy groups such as a methoxy group, an ethoxy group, a propoxy group, and a butoxy group; and halogen atoms such as a fluorine atom, a chlorine atom, a bromine atom, and an iodine atom.

The m denotes a natural number of 2 or more, preferably from 10 through 100. The n denotes a natural number of 0 or 2 or more, preferably from 10 through 100.

Specific examples of the polythiophene derivative will now be given, but the polythiophene derivative is not limited to these examples.

1 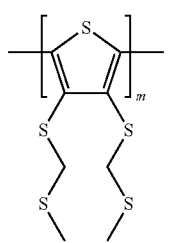
2 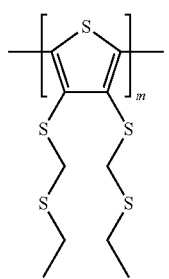
3 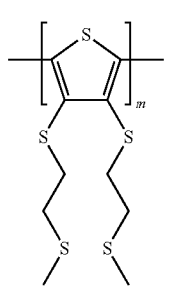
4 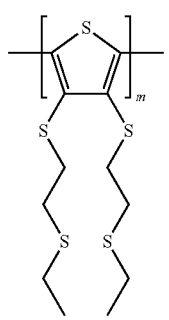
5 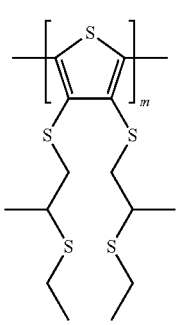
6 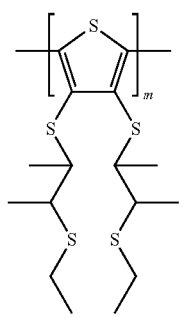
7 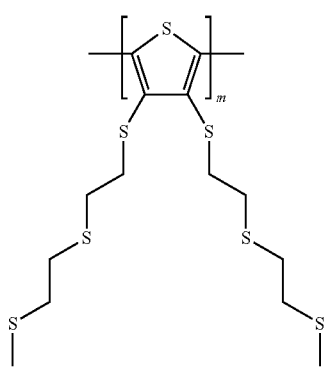
8 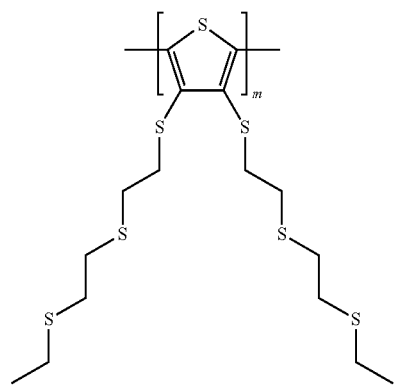
9 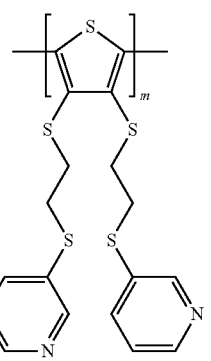

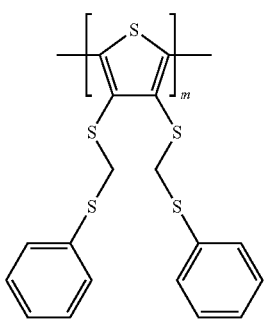
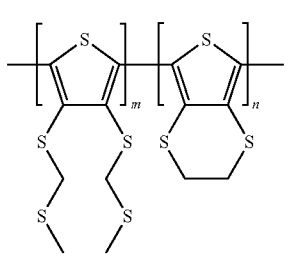
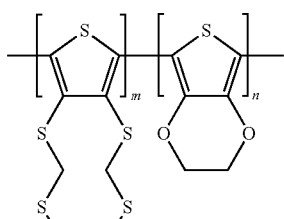
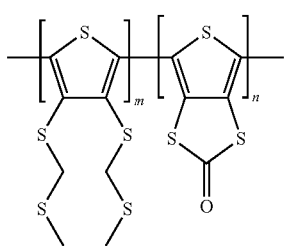
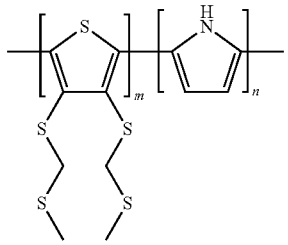
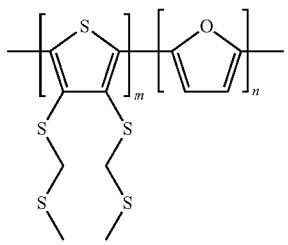

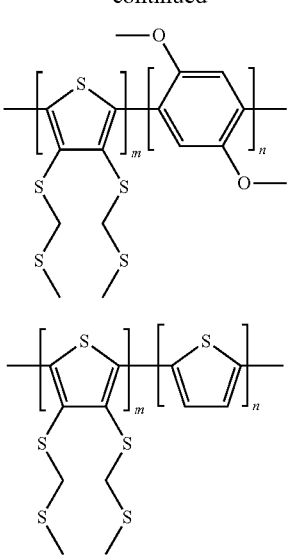

Note that, the polythiophene derivative may have two or more types of structures represented by a formula described below in a molecule of the polythiophene derivative, as illustrated by Compounds 12 and 13.

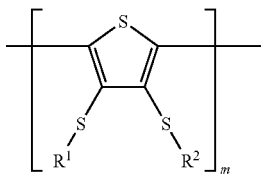

When the polythiophene derivative is a copolymer, the polythiophene derivative may be a block copolymer or a random copolymer.

The polythiophene derivative can be obtained by polymerizing thiophene derivatives obtained through Reaction scheme (1) or (2) below.

A thiophene derivative represented by General Formula (2) or (3) below can be synthesized by the method described in Synthetic Communications 28 (12), 2237-2244 (1998). That is, the thiophene derivative can be obtained by a nucleophilic substitution reaction between alkoxy-substituted thiophenes (e.g., 3,4-dimethoxythiophene) and dithiols with an acid catalyst and then a nucleophilic substitution reaction into halogenated alkyls. The dithiols and the halogenated alkyls may be reacted in advance. A reaction temperature is from about 0° C. through about 150° C., preferably from about 50° C. through about 130° C. Acids (Bronsted acids) such as sulfuric acid, hydrochloric acid, phosphoric acid, methanesulfonic acid, trichloroacetic acid, trifluoroacetic acid, and p-toluenesulfonic acid are used as the acid catalyst. Inorganic bases such as potassium carbonate, sodium carbonate, sodium hydrogen carbonate, potassium hydroxide, and sodium hydroxide can be used as bases. In the reaction between the alkoxy-substituted thiophenes and the dithiols, for example, toluene, xylene, anisole, tetralin, methylcyclohexane, ethylcyclohexane, chlorobenzene, or o-dichlorobenzene can be used as reaction catalysts. In the reaction between thiols and the halogenated alkyls, for example, acetone, 2-butanone, N,N-dimethylformamide, or N,N-dimethylacetamide can be used as reaction catalysts. Note that, in the schemes described below, for example, $R^a$ denotes an alkylene group and $R^b$ denotes an alkyl group.

Reaction Scheme (1)

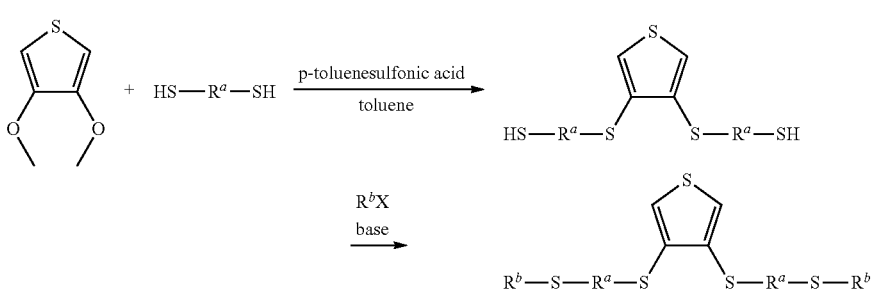

Reaction Scheme (2)

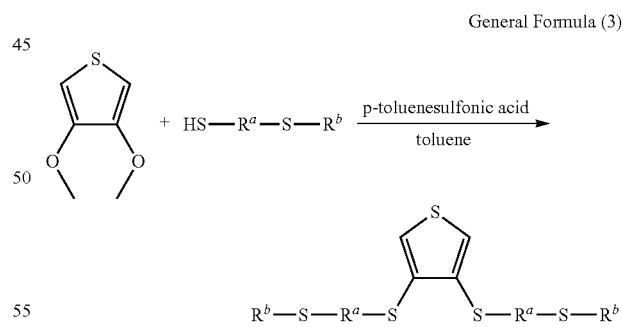

The polythiophene derivative can be polymerized through an oxidative coupling polymerization using an oxidizing agent. Examples of the oxidizing agent include iron(III) chloride and aromatic sulfonic acid metal salts.

Specific examples of the aromatic sulfonic acid metal salts include ferric o-toluenesulfonate, ferric m-toluenesulfonate, ferric p-toluenesulfonate, cupric o-toluenesulfonate, cupric m-toluenesulfonate, cupric p-toluenesulfonate, cobalt o-toluenesulfonate, cobalt m-toluenesulfonate, cobalt p-toluenesulfonate, manganese o-toluenesulfonate, manganese m-toluenesulfonate, manganese p-toluenesulfonate, ferric o-ethylbenzenesulfonate, ferric m-ethylbenzenesulfonate, ferric p-ethylbenzenesulfonate, ferric naphthalenesulfonate, and derivatives thereof. Alcoholic solvents such as methanol, ethanol, and butanol; halogenated hydrocarbons such as chloroform, dichloromethane, and 1,2-dichloroethane; aromatic hydrocarbons such as toluene, xylene, anisole, chlorobenzene, o-dichlorobenzene, and nitrobenzene; acetonitrile, and benzonitrile can be used as solvents upon reaction. Mixtures of the above-described solvents may be used.

The polythiophene derivative may be used as an electrode active material for a cathode and an anode. Generally, the polythiophene derivative is particularly preferably used as an active material for a cathode from the viewpoint of energy density of a material used for an anode.

When the polythiophene derivative is used as a cathode active material, an active material for an anode layer may be, for example, graphite, amorphous carbon, lithium metal, lithium alloy, lithium-ion storing carbon, or conductive polymers. These may be used alone or in combination. A shape of the active material for an anode layer is not particularly limited. For example, the lithium metal may be in the form of bulk, compressed powder, fiber, or flake, as well as thin film.

When the polythiophene derivative is used as an anode active material, an active material for a cathode layer may be, for example, metal oxide particles, disulfide compounds, nitroxy radical compounds, and conductive polymeric compounds. Examples of the metal oxide include lithium manganates such as $LiMnO_2$, $LiNi_{0.5}Mn_{1.5}O_4$, and $LixMn_2O_4$ ($0<x<2$), or lithium manganates having Spinel structure; layered compounds such as $LiCoO_2$, $LiNiO_2$, and $LiNi_{1/3}Co_{1/3}Mn_{1/3}O_2$; and phosphate compounds such as $LiFePO_4$, $LiCoPO_4$, and $LiNiPO_4$. Examples of the disulfide compounds include dithioglycol, 2,5-dimercapto-1,3,4-thiadiazole, and S-triazine-2,4,6-trithiol. Examples of the conductive polymeric compounds include polyacetylene, polyphenylene, polythiophene, polyaniline, and polypyrrole.

These materials for a cathode layer may be used alone or in combination. A composite active material produced by mixing these materials with conventionally known active materials may be used.

When the polythiophene derivative is used to produce a cathode electrode, materials other than the polythiophene derivative, for example, metal oxides or redox compounds may be used in combination. Examples of the metal oxides include lithium manganates such as $LiMnO_2$, $LiNi_{0.5}Mn_{1.5}O_4$, and $LixMn_2O_4$ ($0<x<2$), or lithium manganates having Spinel structure; layered compounds such as $LiCoO_2$, $LiNiO_2$, and $LiNi_{1/3}Co_{1/3}Mn_{1/3}O_2$; and phosphate compounds such as $LiFePO_4$, $LiCoPO_4$, and $LiNiPO_4$. Examples of the redox compounds include organic compounds such as oxy redox compounds, nitroxyl redox compounds, nitrogen redox compounds, carbon redox compounds, and boron redox compounds.

Specific examples of the redox compounds include compounds represented by Formulae (R-1) to (R-12) below, but the redox compounds are not limited thereto. Note that, n in the Formulae denotes a natural number that denotes the number of repeating units.

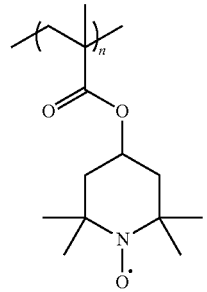

(R-1)

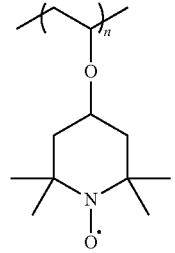

(R-2)

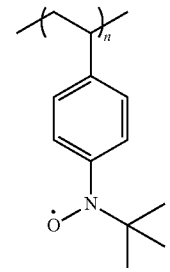

(R-3)

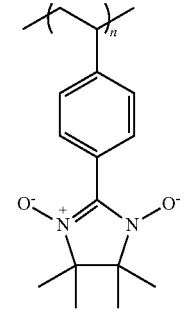

(R-4)

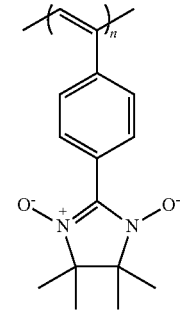

(R-5)

-continued

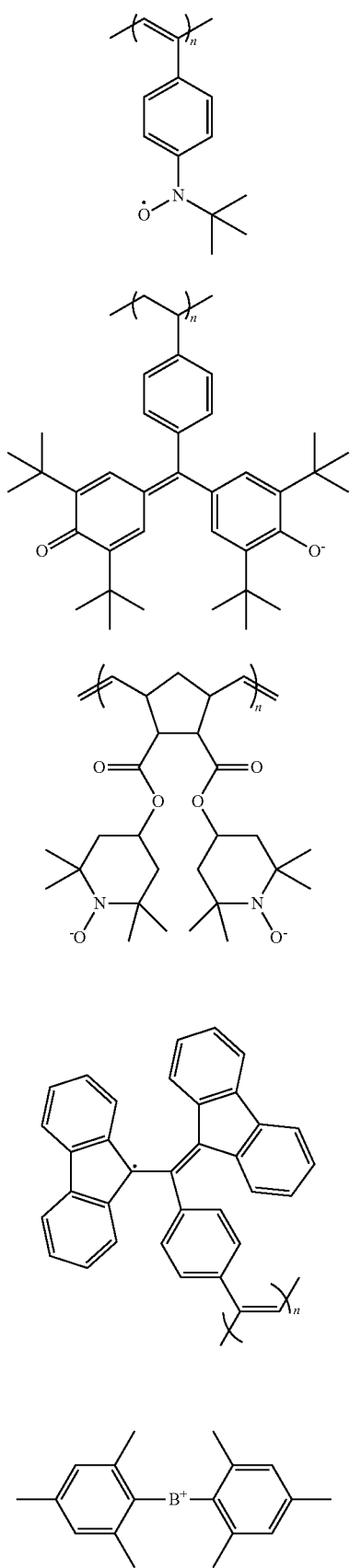

(R-6)
(R-7)
(R-8)
(R-9)
(R-10)

-continued

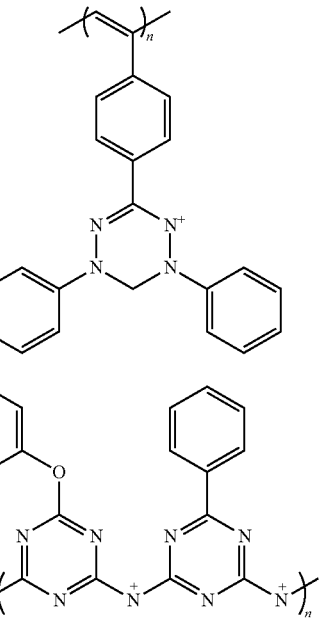

(R-11)
(R-12)

<Binder>

When the polythiophene derivative is used as the cathode active material, a binder may be used for enhancing binding between components. Examples of the binder include resin binders such as polyvinylidene fluoride, vinylidene fluoride-hexafluoropropylene copolymers, vinylidene fluoride-tetrafluoroethylene copolymers, styrene-butadiene copolymer rubber, polypropylene, polyethylene, polyimide, and various polyurethane.

<Collector>

A collector in the present invention is formed of a conductor and is configured to collect charges generated from an electrode of a battery. In an example illustrated in FIG. 1, as an anode collector 3 and a cathode collector 4, metallic foils or metallic plates that are made of, for example, nickel, aluminium, copper, gold, silver, aluminium alloys, and stainless; mesh-like electrodes; and carbon electrode may be used. The active material may be chemically bonded with the collector.

<Separator and Sealing Material>

A separator 5 in FIG. 1 is configured to prevent the cathode layer 2 and the anode layer 1 from contacting with each other to cause a short-circuit. Materials such as porous polymeric films or nonwoven fabrics may be used. The separator is preferably impregnated with the electrolyte. Note that, when the solid electrolyte such as an ion conductive polymer is used as the electrolyte, the separator itself may be omitted. A stainless steel outer material (sealing material) 6 in FIG. 1 is not particularly limited and may be conventionally known materials to be used for outer materials of batteries.

<Electrolyte>

The electrolyte used in the present invention is configured to transport charge carriers between the anode layer 1 and the cathode layer 2, and generally has ion conductivity in a range of from $10^{-5}$ S/cm through $10^{-1}$ S/cm at room temperature. The electrolyte may be an electrolytic solution in which an electrolyte salt is dissolved into a solvent. Examples of the electrolyte salt include conventionally known materials such as $LiPF_6$, $LiClO_4$, $LiBF_4$, $LiCF_3SO_3$, $Li(CF_3SO_2)_2N$, $Li(C_2F_6SO_2)_2N$, $Li(CF_3O_2)_3C$, and $Li(C_2F_8O_2)_3C$.

Examples of the solvent used for the electrolytic solution include organic solvents such as ethylenecarbonate, propylenecarbonate, dimethylcarbonate, diethylcarbonate, methylethylcarbonate, γ-butyrolactone, tetrahydrofuran, dioxolane, sulfolane, dimethylformamide, dimethylacetamide, and N-methyl-2-pyrrolidone. Note that, these solvents may be used alone or in combination.

In the present invention, the solid electrolyte may be used as the electrolyte.

Examples of the polymeric compounds used for the solid electrolyte include vinylidene fluoride copolymers such as polyvinylidene fluoride, vinylidene fluoride-hexafluoropropylene copolymers, vinylidene fluoride-ethylene copolymers, vinylidene fluoride-monofluoroethylene copolymers, vinylidene fluoride-trifluoroethylene copolymers, vinylidene fluoride-tetrafluoroethylene copolymers, and vinylidene fluoride-hexafluoropropylene-tetrafluoroethylene terpolymers; acrylonitrile polymers such as acrylonitrile-methyl methacrylate copolymers, acrylonitrile-methyl acrylate copolymers, acrylonitrile-ethyl methacrylate copolymers, acrylonitrile-ethyl acrylate copolymers, acrylonitrile-methacrylic acid copolymers, acrylonitrile-acrylic acid copolymers, and acrylonitrile-vinyl acetate copolymers; polyethylene oxides, ethylene oxide-propylene oxide copolymers, and polymers of acrylate or methacrylate thereof. Note that, these polymeric compounds may be impregnated with the electrolytic solution to be gelled or may be used as such.

EXAMPLES

The present invention will now be described in more detail by way of Examples and Comparative Examples, but the present invention is not limited to Examples.

Synthetic Example 1

Synthesis of 3,4-bis[1-[(methylthio)methyl]thio]thiophene

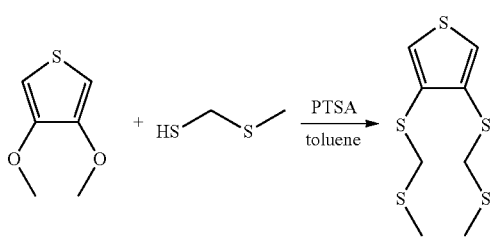

A 300 mL four-necked flask was charged with 0.23 g (1.2 mmol) of p-toluenesulfonic acid monohydrate (PTSA) and 70 mL of toluene. Under an Ar stream, the flask was equipped with a Dean and Stark strap and a condenser, and the content of the flask was dehydrated at reflux. After dehydration at reflux for 90 min, the flask was left to stand to cool. At the time point when the content of the flask was about room temperature, 2.4 g (16.6 mmol) of 3,4-dimethoxythiophene and 3.75 g (39.8 mmol) of methylthiomethanethiol were added to the flask. A bath temperature was adjusted so that an internal temperature of the flask was 90° C., and then a reaction was initiated. Completion of the reaction was checked by HPLC (product of Tosoh Corporation, PD-8020 high pressure gradient HPLC, column (product of GL Sciences Inc., ODS-3, 4.6 mm in diameter× 250 mm), mobile layer (tetrahydrofuran/water=6/4 (v/v)), flow rate (1.0 mL/min)). Then, the content of the flask was cooled, and partitioned with water (50 mL×3), sodium bicarbonate water (50 mL×2), and water (50 mL×2). The resultant organic layer was concentrated in a draft to obtain a tan oil. This was purified by silica gel chromatography (silica 200 g, Toluene/n-hexane=1/2) to obtain 2.4 g of a product of interest (8.9 mmol, yield: 53.6%) as a light yellow oil.

Synthetic Example 2

Synthesis of 3,4-bis[2-[(methylthio)ethyl]thio]thiophene

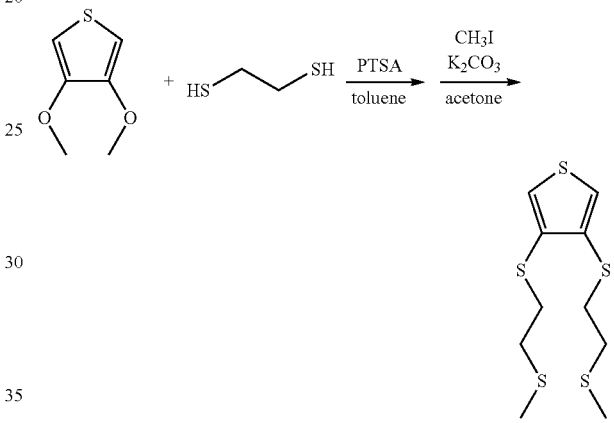

A 500 mL four-necked flask was charged with 0.23 g (1.2 mmol) of p-toluenesulfonic acid monohydrate (PTSA) and 40 mL of toluene. Under an Ar stream, the flask was equipped with a Dean and Stark strap and a condenser, and the content of the flask was dehydrated at reflux. After dehydration at reflux for 90 min, the flask was left to stand to cool. At the time point when the content of the flask was about room temperature, 2.4 g (16.6 mmol) of 3,4-dimethoxythiophene and 15.6 g (166 mmol) of ethanedithiol were added to the flask. A bath temperature was adjusted so that an internal temperature of the flask was 90° C., and then a reaction was initiated. Completion of the reaction was checked by HPLC (product of Tosoh Corporation, PD-8020 high pressure gradient HPLC, column (product of GL Sciences Inc., ODS-3, 4.6 mm in diameter×250 mm), mobile layer (tetrahydrofuran/water=6/4 (v/v)), flow rate (1.0 mL/min)). Then, the content of the flask was cooled, and partitioned with water (50 mL×3), sodium bicarbonate water (50 mL×2), and water (50 mL×2). The resultant organic layer was concentrated to obtain a tan oil. Subsequently, the resultant oil was dissolved in 60 mL of acetone, and added with 5.04 g (36.5 mmol) of potassium carbonate and 5.7 g (39.8 mmol) of iodomethane, followed by allowing to react at 50° C. for 6 h. After concentrating the solvent, the resultant was dissolved in 100 mL of toluene, and partitioned with water (50 mL×3). The resultant organic layer was concentrated in a draft to obtain a tan oil. This was purified by silica gel chromatography (silica 200 g, toluene) to obtain 2.88 g of a product of interest (9.7 mmol, yield: 58.7%) as a light yellow oil.

Synthetic Example 3

Synthesis of 3,4-bis[2-[(phenylthio)ethyl]thio]thiophene

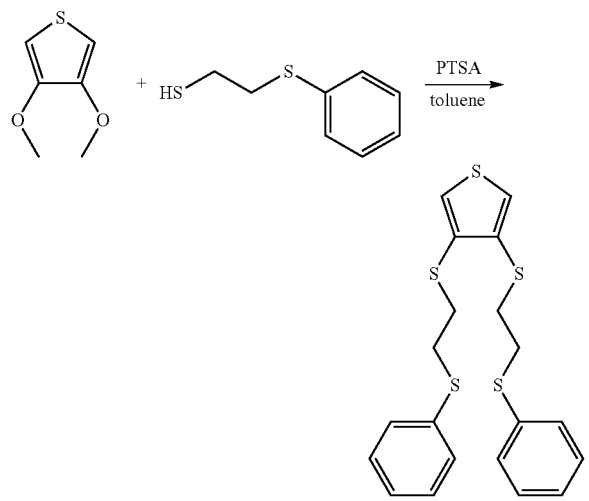

A 300 mL four-necked flask was charged with 0.23 g (1.2 mmol) of p-toluenesulfonic acid monohydrate (PTSA) and 70 mL of toluene. Under an Ar stream, the flask was equipped with a Dean and Stark strap and a condenser, and the content of the flask was dehydrated at reflux. After dehydration at reflux for 90 min, the flask was left to stand to cool. At the time point when the content of the flask was about room temperature, 2.4 g (16.6 mmol) of 3,4-dimethoxythiophene and 6.7 g (39.8 mmol) of phenylthioethanethiol were added to the flask. A bath temperature was adjusted so that an internal temperature of the flask was 90° C., and then a reaction was initiated. Completion of the reaction was checked by HPLC (product of Tosoh Corporation, PD-8020 high pressure gradient HPLC, column (product of GL Sciences Inc., ODS-3, 4.6 mm in diameter× 250 mm), mobile layer (tetrahydrofuran/water=6/4 (v/v)), flow rate (1.0 mL/min)). Then, the content of the flask was cooled, and partitioned with water (50 mL×3), sodium bicarbonate water (50 mL×2), and water (50 mL×2). The resultant organic layer was concentrated to obtain a tan oil. This was purified by silica gel chromatography (silica 200 g, Toluene/n-hexane=1/1) to obtain 5.02 g of a product of interest (11.9 mmol, yield: 72.0%) as a light yellow wax.

Synthetic Example 4

Synthesis of 3,4-bis[[2-[[2-(methylthio)ethyl]thio]ethyl]thio]thiophene

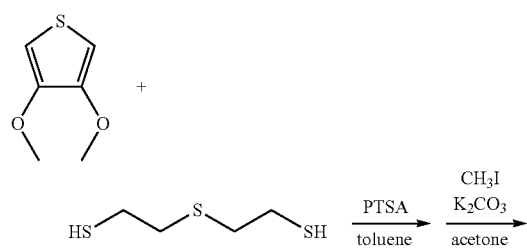

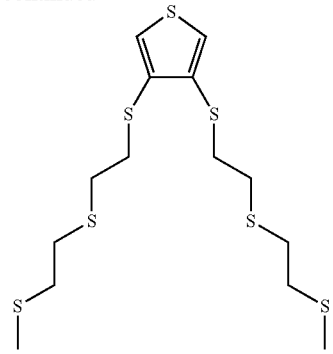

A 300 mL four-necked flask was charged with 0.23 g (1.2 mmol) of p-toluenesulfonic acid monohydrate (PTSA) and 70 mL of toluene. Under an Ar stream, the flask was equipped with a Dean and Stark strap and a condenser, and the content of the flask was dehydrated at reflux. After dehydration at reflux for 90 min, the flask was left to stand to cool. At the time point when the content of the flask was about room temperature, 2.4 g (16.6 mmol) of 3,4-dimethoxythiophene and 20.5 g (132.8 mmol) of bis(2-mercaptoethyl)sulfide were added to the flask. A bath temperature was adjusted so that an internal temperature of the flask was 90° C., and then a reaction was initiated. Completion of the reaction was checked by HPLC (product of Tosoh Corporation, PD-8020 high pressure gradient HPLC, column (product of GL Sciences Inc., ODS-3, 4.6 mm in diameter× 250 mm), mobile layer (tetrahydrofuran/water=6/4 (v/v)), flow rate (1.0 mL/min)). Then, the content of the flask was cooled, and partitioned with water (50 mL×3), sodium bicarbonate water (50 mL×2), and water (50 mL×2). The resultant organic layer was concentrated in a draft to obtain a tan oil. Subsequently, the resultant oil was dissolved in 60 mL of acetone, and added with 5.04 g (36.5 mmol) of sodium hydroxide and 5.7 g (39.8 mmol) of iodomethane, followed by allowing to react at 50° C. for 6 h. After concentrating the solvent, the resultant was dissolved in 100 mL of toluene, and partitioned with water (50 mL×3). The resultant organic layer was concentrated in a draft to obtain a tan oil. This was purified by silica gel chromatography (silica 200 g, toluene) to obtain 3.1 g of a product of interest (7.5 mmol, yield: 44.9%) as a light yellow oil.

Example 1

Synthesis of Compound (1)

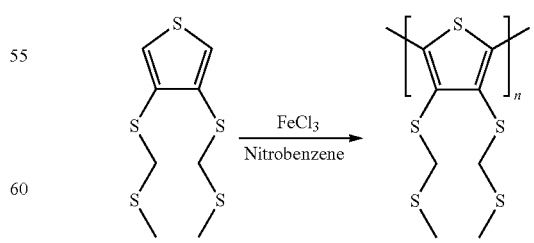

Figure 2:
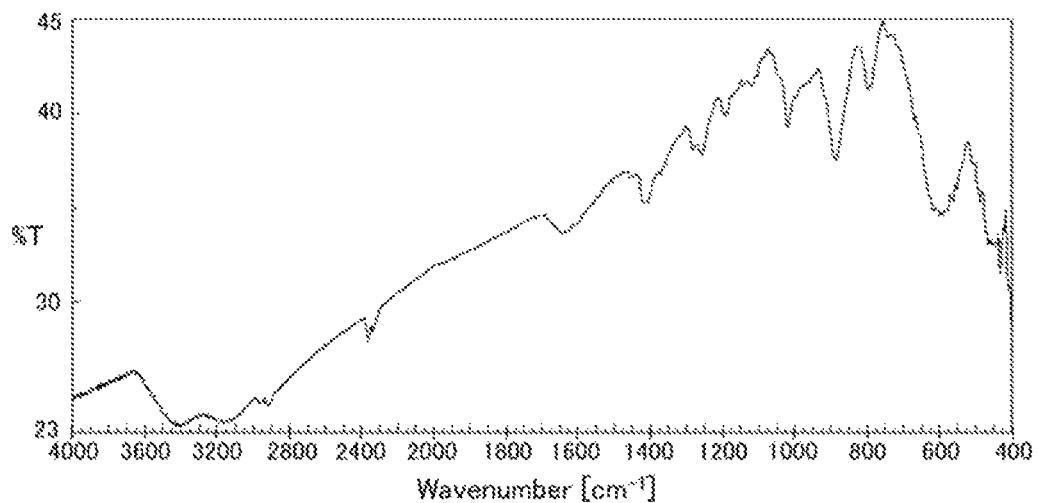
FIG. 2 is an IR spectrogram of Compound (1) used in Example of the present invention.

A 25 mL four-necked flask was charged with 0.36 g (2.2 mmol) of anhydrous iron(III) chloride and 10 mL of nitrobenzene, and then added dropwise with 0.15 g (0.56 mmol) of 3,4-bis[1-[(methylthio)methyl]thio]thiophene and 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, washing with water, and drying at 80° C. under reduced pressure to obtain 0.13 g of Compound (1) (yield: 87.6%) as a brown solid. A FT-IR spectrum of the Compound (1) is illustrated in FIG. 2.

The resultant brown solid of the Compound (1) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone). This can prevent an active material from eluting into an electrolyte during a charge and discharge cycle of a secondary battery. Therefore, the above-described fact with regard to solubility is important in order to achieve a stable charge and discharge cycle of a secondary battery.

Example 2

Synthesis of Compound (3)

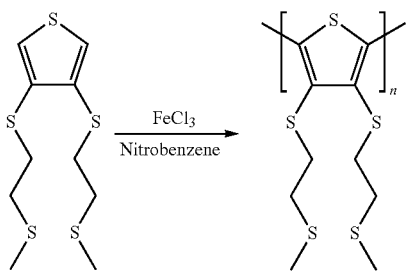

Figure 3:
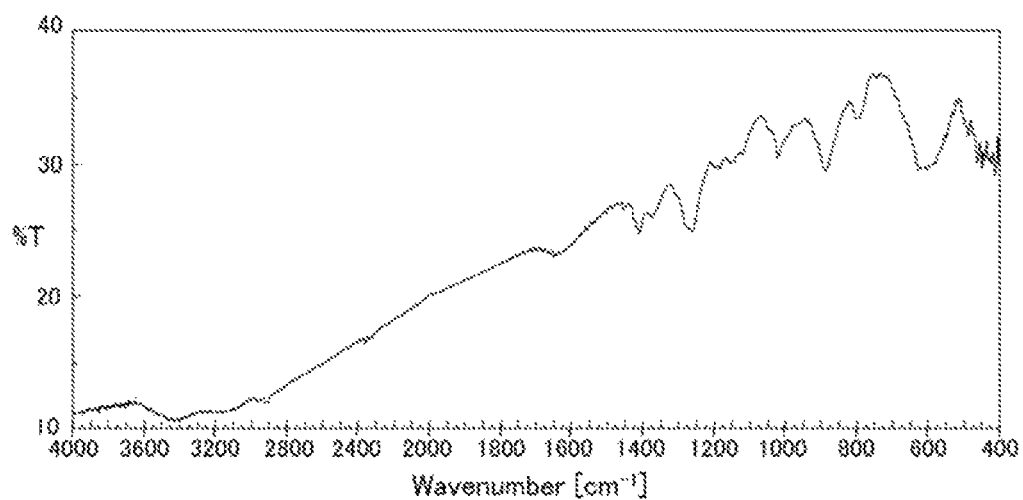
FIG. 3 is an IR spectrogram of Compound (3) used in Example of the present invention.

A 25 mL four-necked flask was charged with 0.32 g (2.0 mmol) of anhydrous iron(III) chloride and 10 mL of nitrobenzene, and then added dropwise with 0.15 g (0.50 mmol) of 3,4-bis[2-[(methylthio)ethyl]thio]thiophene and 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, and washing with water. The resultant brown solid was dried at 80° C. under reduced pressure again to obtain 0.14 g of Compound (3) (yield: 93.3%) as a brown solid. A FT-IR spectrum of the Compound (3) is illustrated in FIG. 3.

The resultant brown solid of the Compound (3) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone).

Example 3

Synthesis of Compound (7)

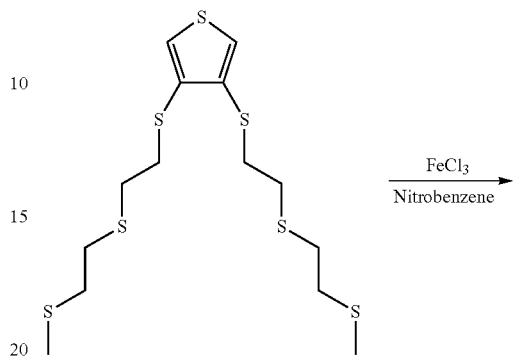

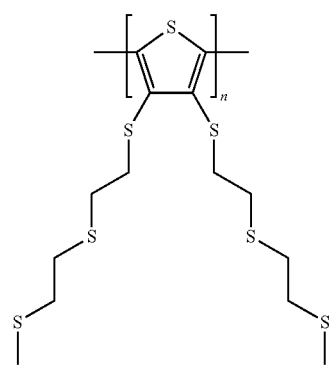

Figure 4:
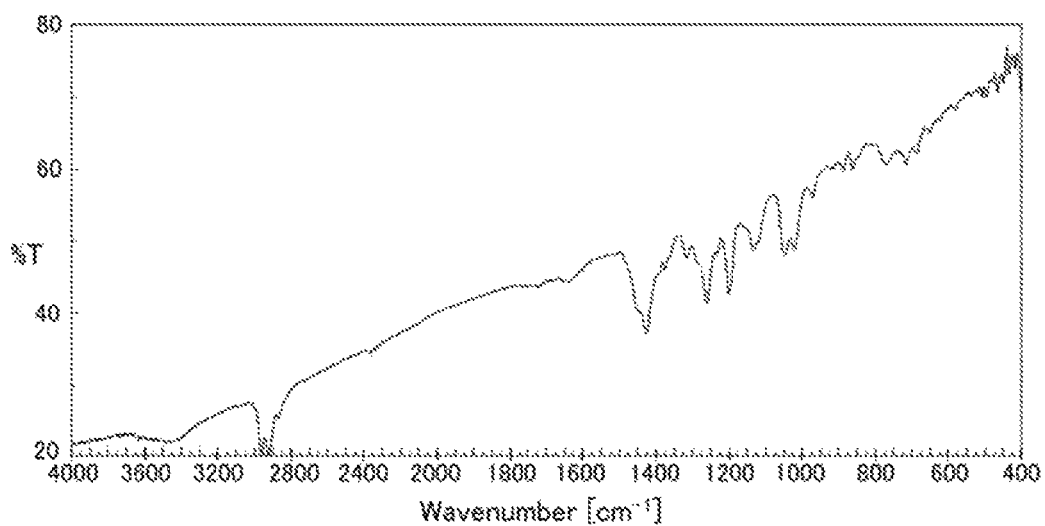
FIG. 4 is an IR spectrogram of Compound (7) used in Example of the present invention.

A 25 mL four-necked flask was charged with 0.23 g (1.4 mmol) of anhydrous iron(III) chloride and 10 mL of nitrobenzene, and then added dropwise with 0.15 g (0.36 mmol) of 3,4-bis[[2-[[2-(methylthio)ethyl]thio]ethyl]thio]thiophene and 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, and washing with water. The resultant brown solid was dried at 80° C. under reduced pressure again to obtain 0.10 g of Compound (7) (yield: 66.7%) as a brown solid. A FT-IR spectrum of the Compound (7) is illustrated in FIG. 4.

The resultant brown solid of the Compound (7) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone).

Example 4

Synthesis of Compound (11)

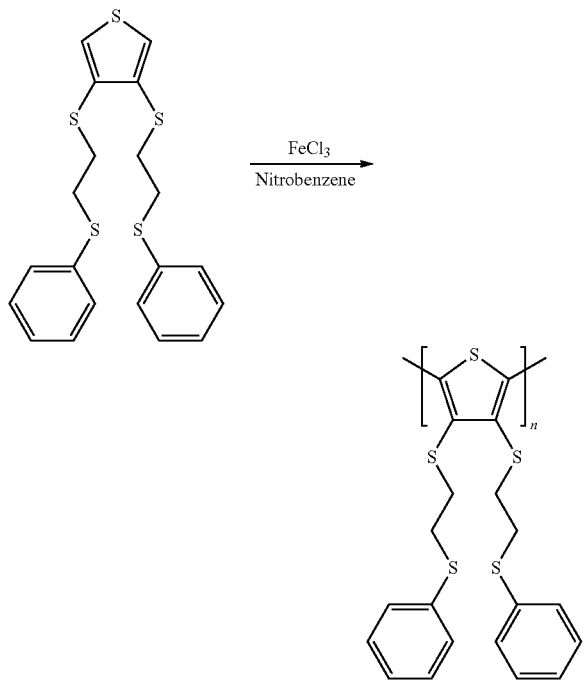

Figure 5:
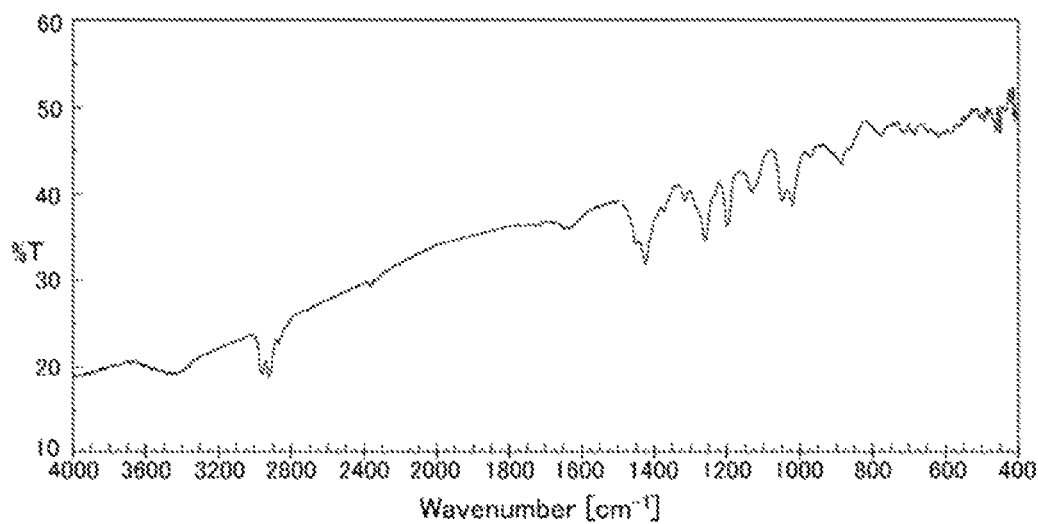
FIG. 5 is an IR spectrogram of Compound (11) used in Example of the present invention.

A 25 mL four-necked flask was charged with 0.23 g (1.4 mmol) of anhydrous iron(III) chloride and 10 mL of nitrobenzene, and then added dropwise with 0.15 g (0.36 mmol) of 3,4-bis[2-[(phenylthio)ethyl]thio]thiophene and 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, and washing with water. The resultant brown solid was dried at 80° C. under reduced pressure again to obtain 0.13 g of Compound (11) (yield: 86.7%) as a brown solid. A FT-IR spectrum of the Compound (11) is illustrated in FIG. 5.

The resultant brown solid of the Compound (11) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone).

Example 5

Synthesis of Compound (15)

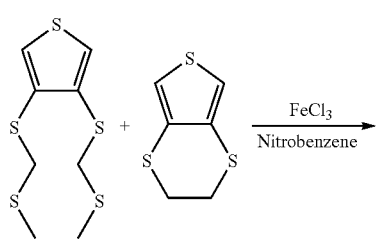

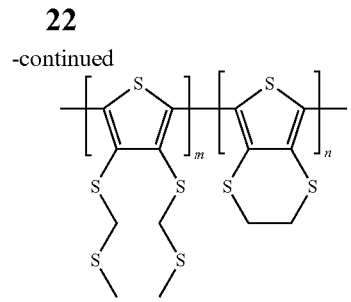

Figure 6:
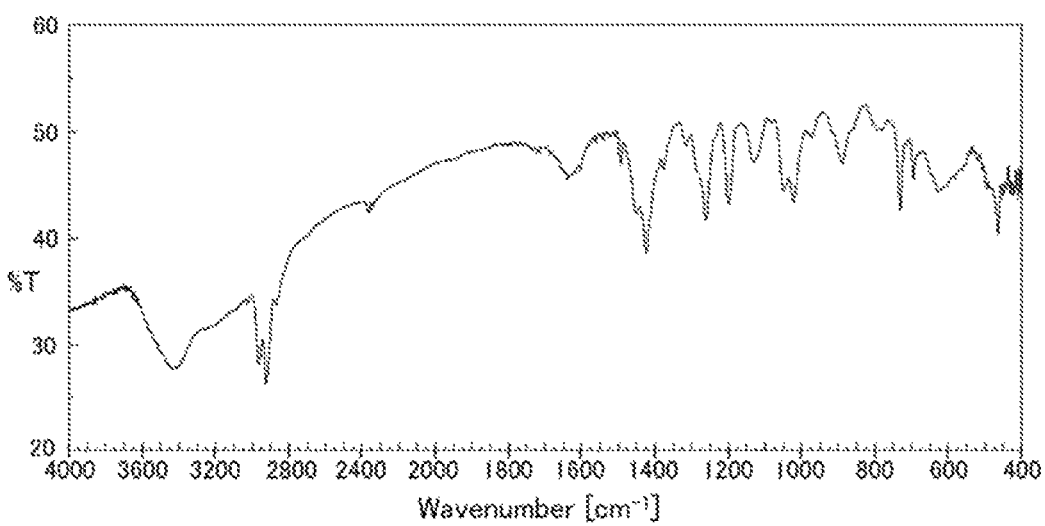
FIG. 6 is an IR spectrogram of Compound (15) used in Example of the present invention.

A 25 mL four-necked flask was charged with 0.36 g (2.2 mmol) of anhydrous iron(III) chloride and 10 mL of nitrobenzene, and then added dropwise with a solution of 0.075 g (0.28 mmol) of 3,4-bis[1-[(methylthio)methyl]thio]thiophene and 0.049 (0.28 mmol) of 3,4-ethylenedithiothiophene in 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, and washing with water. The resultant brown solid was dried at 80° C. under reduced pressure again to obtain 0.089 g of Compound (15) (yield: 72.0%) as a brown solid. A FT-IR spectrum of the Compound (15) is illustrated in FIG. 6.

The resultant brown solid of the Compound (15) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone).

Example 6

Synthesis of Compound (20)

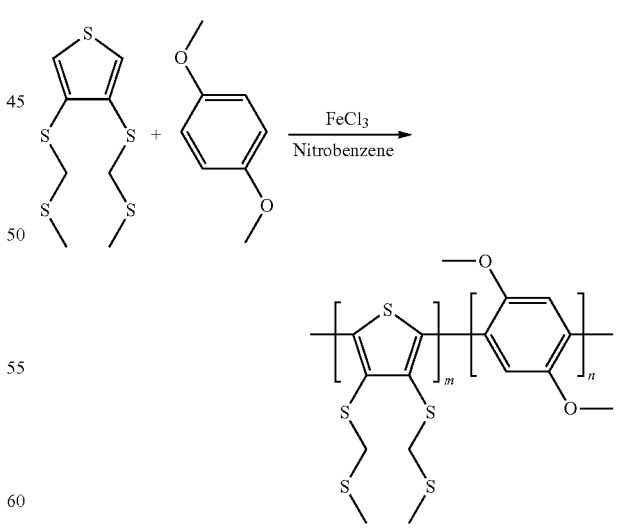

Figure 7:
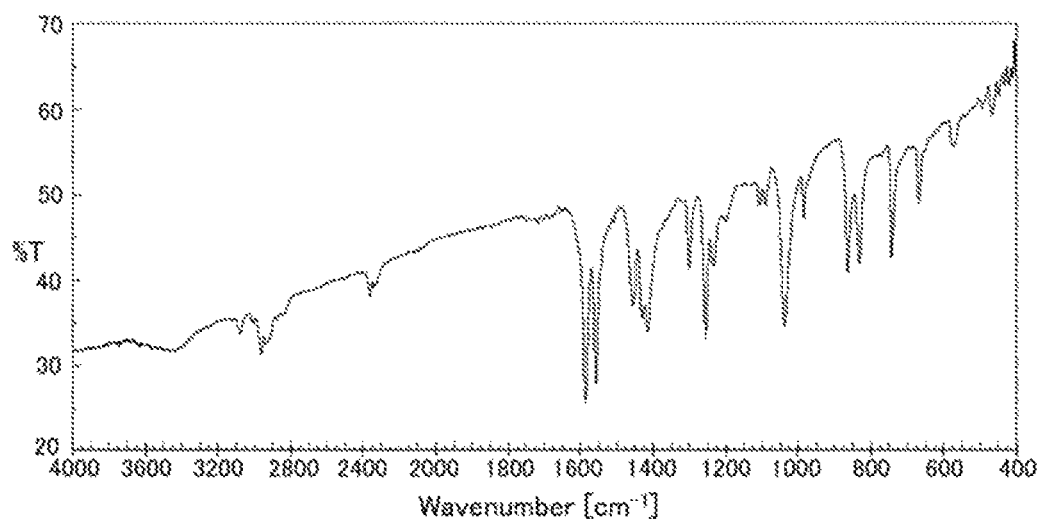
FIG. 7 is an IR spectrogram of Compound (20) used in Example of the present invention.

A 25 mL four-necked flask was charged with 0.36 g (2.2 mmol) of anhydrous iron(III) chloride and 10 mL of nitrobenzene, and then added dropwise with a solution of 0.075 g (0.28 mmol) of 3,4-bis[1-[(methylthio)methyl]thio]thiophene and 0.039 (0.28 mmol) of 1,4-dimethoxybenzene in 3 mL of nitrobenzene with stirring under an Ar stream. After completion of the dropwise addition, the resultant was stirred at from 26° C. through 30° C. for 24 h. The resultant reaction solution was taken into 260 mL of methanol. The precipitated solid was filtered off, washed with 50 mL of methanol, and then dried under reduced pressure. The resultant black material was taken into 50 mL of a 50% by mass aqueous hydrazine monohydrate solution, followed by stirring for 1 day, filtering off, and washing with water. The resultant brown solid was dried at 80° C. under reduced pressure again. This brown solid was extracted with methanol using a Soxhlet extractor with a thimble for 48 h to obtain 0.077 g of Compound (20) (yield: 67.6%) as a brown solid. A FT-IR spectrum of the Compound (20) is illustrated in FIG. 7.

The resultant brown solid of the Compound (20) was insoluble in organic solvents commonly used for an electrolytic solution (dichloromethane, acetonitrile, ethylenecarbonate, propylenecarbonate, dimethylcarbonate, diethylcarbonate, methylethylcarbonate, γ-butyrolactone).

Example 7

Production of Battery

The compound (1), graphite serving as a conductive aid, and poly(vinylidene fluoride) serving as a binder were mixed together. To this, was added N-methylpyrrolidone, followed by kneading until homogeneous to obtain black paste. The compound (1), the graphite, and the binder were mixed in a mass ratio of 2:6:2. Subsequently, the resultant paste was uniformly coated onto a sheet of aluminium foil using a tool for blade coating. The resultant coating film was placed into a hot air drier previously set at 120° C. and dried for 20 min to produce an electrode layer.

The resultant electrode layer was die cut into a circle having a diameter of 16 mm, which was used as a circular cathode electrode. Then, the circular cathode electrode, a porous polypropylene film separator having a diameter of 25 mm, and an anode formed of a circular Li metallic foil having a diameter of 16 mm were laminated in this order in an stainless steel outer material within a glove box (dew point: −70° C. or lower). To the resultant, was added, as an electrolyte, a mixed solution of ethylenecarbonate/diethylcarbonate (volume ratio: 1:2) containing 1.0 mol/L of $LiPF_6$ electrolyte salt. Finally, the outer material was sealed with a stainless steel cap. Thus, a battery of Example 7 was produced.

Example 8

A battery of Example 8 was produced in the same manner as in Example 7, except that the Compound (1) was changed to a polythiophene derivative of the Compound (3) as described in a row of Example 8 in Table 1.

Example 9

A battery of Example 9 was produced in the same manner as in Example 7, except that the Compound (1) was changed to a polythiophene derivative of the Compound (7) as described in a row of Example 9 in Table 1.

Example 10

A battery of Example 10 was produced in the same manner as in Example 7, except that the Compound (1) was changed to a polythiophene derivative of the Compound (11) as described in a row of Example 10 in Table 1.

Example 11

A battery of Example 11 was produced in the same manner as in Example 7, except that the Compound (1) was changed to a polythiophene derivative of the Compound (15) as described in a row of Example 11 in Table 1.

Example 12

A battery of Example 12 was produced in the same manner as in Example 7, except that the Compound (1) was changed to a polythiophene derivative of the Compound (20) as described in a row of Example 12 in Table 1.

Comparative Example 1

A battery of Comparative Example 1 was produced in the same manner as in Example 7, except that the Compound (1) was changed to Comparative Compound 1 described below.

Comparative Compound 1

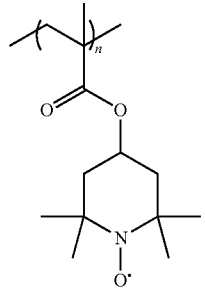

Evaluation of Battery

Figure 8:
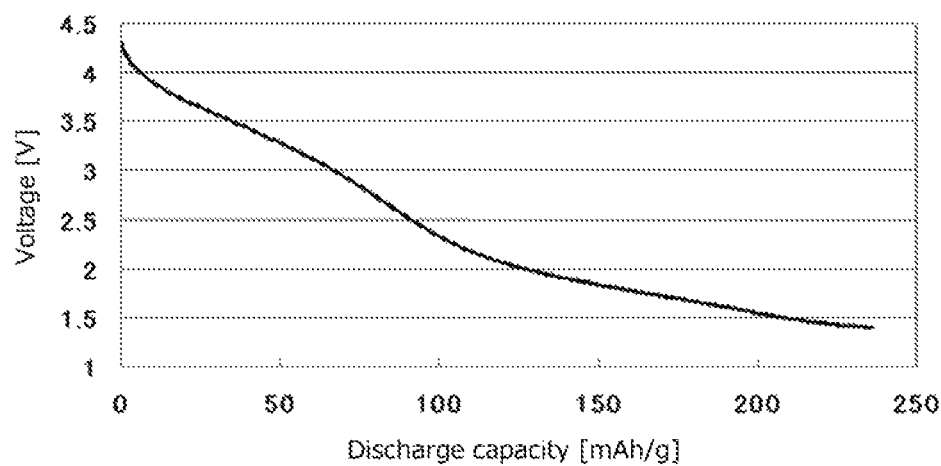
FIG. 8 is a plot of voltage-discharge capacity of a battery of Example 7 of the present invention.

Each of the batteries of Examples 7 to 12 and Comparative Example 1 was charged and discharged with constant current (0.05 mA) at a charge cut-off voltage of 4.5 V and a discharge cut-off voltage of 1.4 V. As a result, discharge capacity per a cathode active material was verified as presented in Table 1. FIG. 8 is a plot of voltage-discharge capacity of the battery of Example 7.

It can be seen from Table 1 that the batteries of Examples including the polythiophene derivative as the active material have significantly higher energy density than the battery of Comparative Example.

In addition, it was confirmed that, when the batteries of Examples 8 to 12 were repeatedly charged and discharged, the batteries operate as secondary batteries.

TABLE 1

| Example/Comparative Example | Compound No. | Discharge capacity |
| --- | --- | --- |
| Example 7 | 1 | 235 mAh/g |
| Example 8 | 3 | 221 mAh/g |
| Example 9 | 7 | 217 mAh/g |
| Example 10 | 11 | 182 mAh/g |
| Example 11 | 15 | 219 mAh/g |
| Example 12 | 20 | 196 mAh/g |
| Comparative Example 1 | Comparative Compound 1 | 85 mAh/g |

DESCRIPTION OF THE REFERENCE NUMERAL 1 anode layer
2 cathode layer
3 anode collector
4 cathode collector
5 separator
6 stainless steel outer material

The invention claimed is:

1. A polythiophene derivative comprising a repeating unit represented by General Formula (1) below:

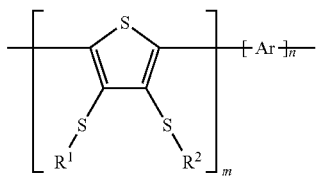

General Formula (1)

where $R^1$ and $R^2$ each independently denote a group having from 2 through 9 carbon atoms represented by —$(R^3$—$S)_p$—$R^4$ (where $R^3$ denotes an alkylene group having from 1 through 4 carbon atoms, $R^4$ denotes an alkyl group having from 1 through 6 carbon atoms or an aromatic group having from 5 through 6 carbon atoms, and p denotes an integer of 1 or 2), Ar denotes an optionally substituted divalent or monovalent aromatic ring moiety or aromatic heterocyclic moiety, m denotes a natural number of 2 or more, and n denotes a natural number of 0 or 2 or more.

2. The polythiophene derivative according to claim 1, wherein the Ar is a thiophene derivative moiety.

3. A method for producing a polythiophene derivative, the method comprising
polymerizing raw material monomers with an oxidizing agent to produce the polythiophene derivative according to claim 1.

4. A cathode active material for a secondary battery, the cathode active material comprising
the polythiophene derivative according to claim 1.

5. A secondary battery comprising
the cathode active material for a secondary battery according to claim 4.

* * * * *